(12) United States Patent
Ham et al.

(10) Patent No.: US 11,114,747 B2
(45) Date of Patent: Sep. 7, 2021

(54) ANTENNA INCLUDING CONDUCTIVE PATTERN AND ELECTRONIC DEVICE INCLUDING THE SAME

(71) Applicant: Samsung Electronics Co., Ltd., Suwon-si (KR)

(72) Inventors: Chungkyun Ham, Suwon-si (KR); Seunggil Jeon, Suwon-si (KR); Jaehun Jung, Suwon-si (KR); Youngsik Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 141 days.

(21) Appl. No.: 16/441,376

(22) Filed: Jun. 14, 2019

(65) Prior Publication Data
US 2019/0386380 A1 Dec. 19, 2019

(30) Foreign Application Priority Data
Jun. 14, 2018 (KR) .......................... 10-2018-0068292

(51) Int. Cl.
*H01Q 1/24* (2006.01)
*H01Q 9/06* (2006.01)
(Continued)

(52) U.S. Cl.
CPC ............... *H01Q 1/243* (2013.01); *H01Q 5/42* (2015.01); *H01Q 9/065* (2013.01); *H01Q 9/42* (2013.01);
(Continued)

(58) Field of Classification Search
CPC ............ H01Q 1/243; H01Q 1/38; H01Q 1/40; H01Q 1/2283; H01Q 5/42; H01Q 9/065;
(Continued)

(56) References Cited

U.S. PATENT DOCUMENTS 8,427,377 B2   4/2013  Wang
2009/0273531 A1  11/2009  Ishizuka et al.
(Continued)

FOREIGN PATENT DOCUMENTS

CN   206271859 U    6/2017
EP   3 537 536 A1   9/2019
(Continued)

OTHER PUBLICATIONS

International Search Report with Written Opinion dated Sep. 26, 2019; International Appln. No. PCT/KR2019/007206.
(Continued)

*Primary Examiner* — Robert Karacsony
(74) *Attorney, Agent, or Firm* — Jefferson IP Law, LLP

(57) ABSTRACT

An electronic device is provided. The electronic device includes a housing including a first plate, a second plate facing away from the first plate, and a side member surrounding a space between the first plate and the second plate, a first PCB disposed in parallel with the first plate in the space between the first plate and the second plate, and including a first face facing the first plate and a second face facing the second plate, at least one conductive plate formed on the second face, a first conductive pattern embedded in the first PCB and disposed to be closer to a portion of the side member than the conductive plate when viewed from
(Continued)

above the first plate, a first wireless communication circuit mounted on a first face of the first PCB, electrically coupled to the conductive plate and the first conductive pattern.

20 Claims, 15 Drawing Sheets

(51) Int. Cl.
  *H01Q 9/42*   (2006.01)
  *H01Q 5/42*   (2015.01)
  *H01Q 21/28*  (2006.01)
  *H01Q 21/06*  (2006.01)
  *H05K 1/16*   (2006.01)
(52) U.S. Cl.
  CPC ........... *H01Q 21/065* (2013.01); *H01Q 21/28* (2013.01); *H05K 1/16* (2013.01)
(58) Field of Classification Search
  CPC ........ H01Q 9/42; H01Q 21/065; H01Q 21/10; H01Q 21/24; H01Q 21/28; H05K 1/16; H05K 1/141; H05K 1/165; H05K 2201/10098; H05K 2201/10265; H04B 1/3816; H04B 1/3888
  See application file for complete search history.

(56) References Cited

U.S. PATENT DOCUMENTS

| | | |
|---|---|---|
| 2013/0249768 A1 | 9/2013 | Anguera Pros et al. |
| 2015/0116169 A1* | 4/2015 | Ying ...................... H01Q 21/08 343/729 |
| 2016/0276734 A1 | 9/2016 | Jin et al. |
| 2017/0062953 A1* | 3/2017 | Teshima ................... H01Q 3/24 |
| 2017/0214120 A1* | 7/2017 | Lee ......... H01Q 21/28 |
| 2019/0260127 A1* | 8/2019 | Shi ......... H01Q 5/371 |

FOREIGN PATENT DOCUMENTS

| | | |
|---|---|---|
| JP | H08-032345 A | 2/1996 |
| KR | 20-0143248 Y1 | 6/1996 |
| KR | 10-1373332 B1 | 3/2014 |
| KR | 10-2017-0087753 A | 7/2017 |
| KR | 10-2018-0013203 A | 2/2018 |
| WO | 2018/084327 A1 | 5/2018 |

OTHER PUBLICATIONS

Extended European Search Report dated Mar. 23, 2021, issued in European Patent Application No. 19819123.1.

* cited by examiner

ANTENNA INCLUDING CONDUCTIVE PATTERN AND ELECTRONIC DEVICE INCLUDING THE SAME

CROSS-REFERENCE TO RELATED APPLICATION(S)

This application is based on and claims priority under 35 U.S.C. § 119 of a Korean patent application number 10-2018-0068292, filed on Jun. 14, 2018, in the Korean Intellectual Property Office, the disclosure of which is incorporated by reference herein in its entirety.

BACKGROUND

1. Field

The disclosure relates to an antenna including a conductive pattern, and an electronic device including the antenna.

2. Description of Related Art

With the development of wireless communication technologies, electronic devices (e.g., communication electronic devices) are widely used in everyday life, and thus the use of content increases exponentially. Due to the rapid increase in the use of the content, network capacity is gradually reaching a limit As low latency data communication is required, there is on-going development in a next generation wireless communication technology (e.g., 5th generation (5G) communication) or a high-speed wireless communication technology such as wireless gigabit alliance (WIGIG) (e.g., 802.11AD) and the like.

Next-generation wireless communication technologies may use a millimeter wave which is substantially greater than or equal to 20 GHz. In order to overcome a high free space loss due to a frequency characteristic and to increase an antenna gain, a communication device including an array structure in which a plurality of antenna elements are arranged with a specific interval may be mounted inside an electronic device.

The electronic device is gradually becoming slimmer, and at least some regions may overlap or be placed close to previously placed antennas since the aforementioned communication device is mounted to the electronic device. The previously placed antennas may decrease in radiation performance since the communication device is placed closely or mounted in an overlapping manner.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide an antenna including a conductive pattern, and an electronic device including the antenna.

Another aspect of the disclosure is to provide an electronic device for mounting a conductive pattern for a frequency in the range of 0.5 GHz to 6 GHz in an antenna structure for a frequency in the range of 6 GHz to 100 GHz.

Additional aspects will be set forth in part in the description which follows and, in part, will be apparent from the description, or may be learned by practice of the presented embodiments.

In accordance with an aspect of the disclosure, an electronic device is provided. The electronic device includes a housing including a first plate, a second plate facing away from the first plate, and a side member surrounding a space between the first plate and the second plate, a first printed circuit board (PCB) disposed in parallel with the first plate in the space between the first plate and the second plate, and including a first face facing the first plate and a second face facing the second plate, at least one conductive plate formed on the second face, a first conductive pattern embedded in the first PCB and disposed to be closer to a portion of the side member than the conductive plate when viewed from above the first plate, a first wireless communication circuit mounted on a first face of the first PCB, electrically coupled to the conductive plate and the first conductive pattern, and configured to perform at least one of transmission and reception of a signal having a frequency in the range of about 6 GHz to 100 GHz, a dielectric structure disposed to the first face between the conductive plate and the side member when viewed from above the first plate, a second conductive pattern constructed on one face of the dielectric structure or embedded at least partially inside thereof, and a second wireless communication circuit electrically coupled to the second conductive pattern and configured to perform at least one of transmission and reception of a signal having a frequency in the range of about 0.5 GHz to 6 GHz.

Various embodiments of the disclosure place a conductive pattern for a frequency in the range of 0.5 GHz to 6 GHz in an antenna structure for a frequency in the range of 6 GHz to 100 GHz. Therefore, the conductive pattern can be prevented from radiation performance degradation caused by close or overlapping placement, thereby ensuring operational reliability of an electronic device.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, like reference numerals will be understood to refer to like parts, components, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
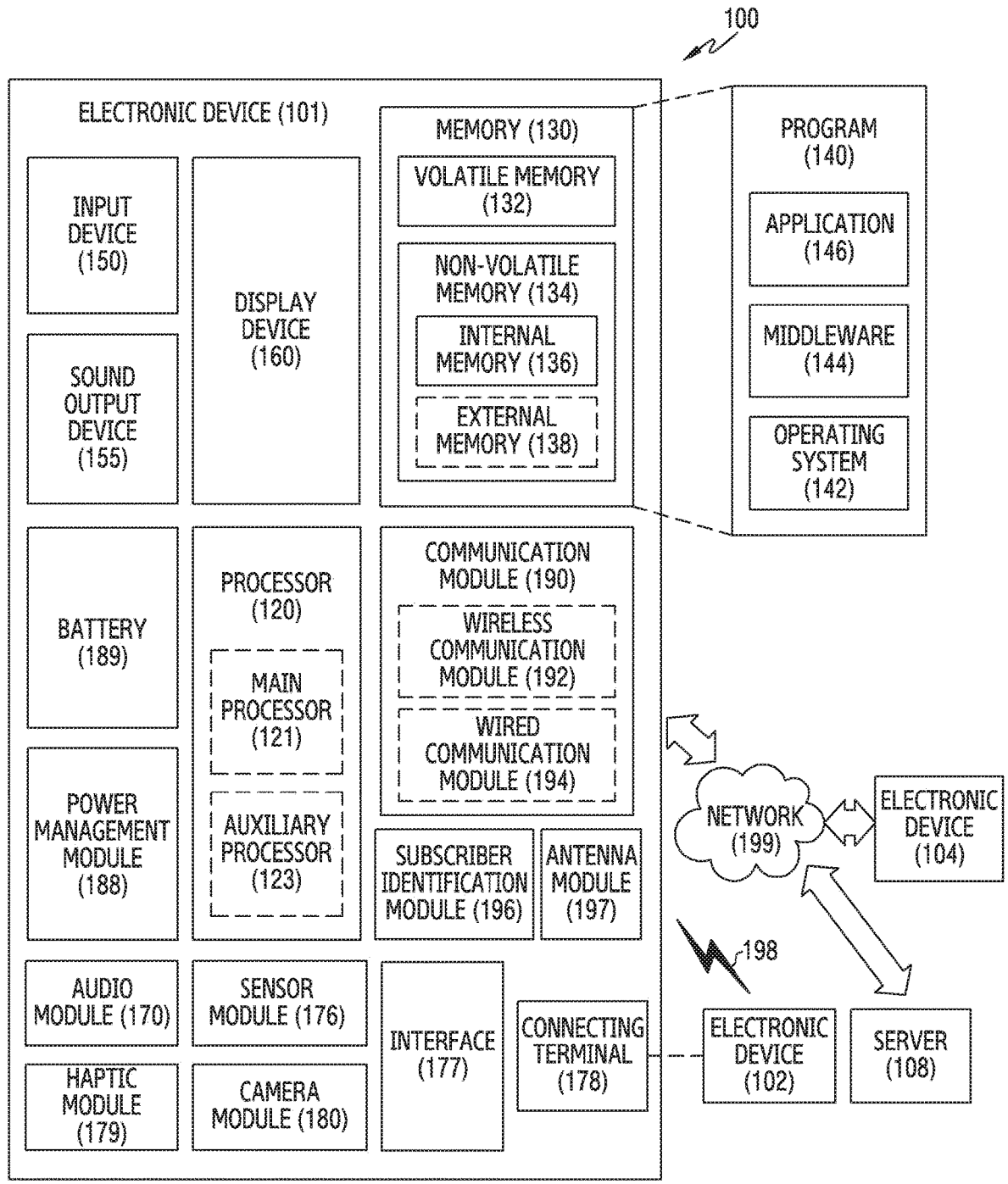
FIG. 1 is a block diagram illustrating an electronic device in a network environment according to an embodiment of the disclosure.

FIG. 1 is a block diagram illustrating an electronic device in a network environment according to an embodiment of the disclosure.

Referring to FIG. 1, an electronic device 101 in a network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in a volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the AP) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, Wi-Fi direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., printed circuit board (PCB)). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2A:
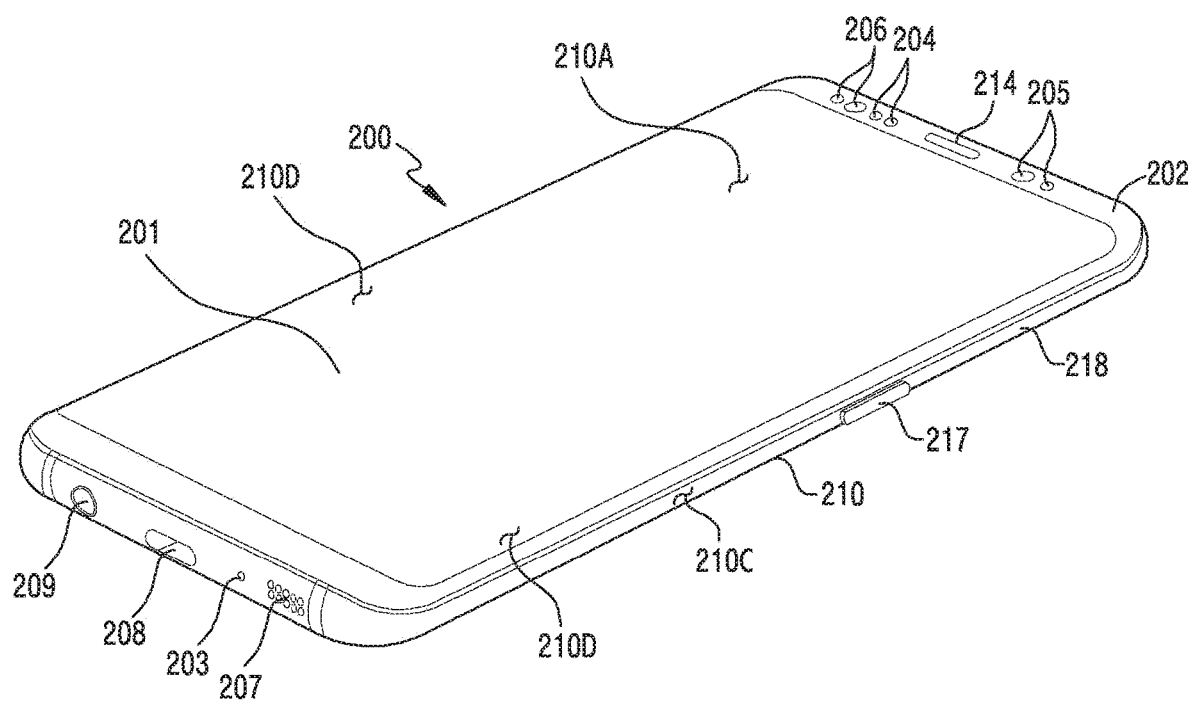
FIG. 2A is a perspective view of a mobile electronic device according to an embodiment of the disclosure.

FIG. 2A is a perspective view of a mobile electronic device according to an embodiment of the disclosure.

Figure 2B:
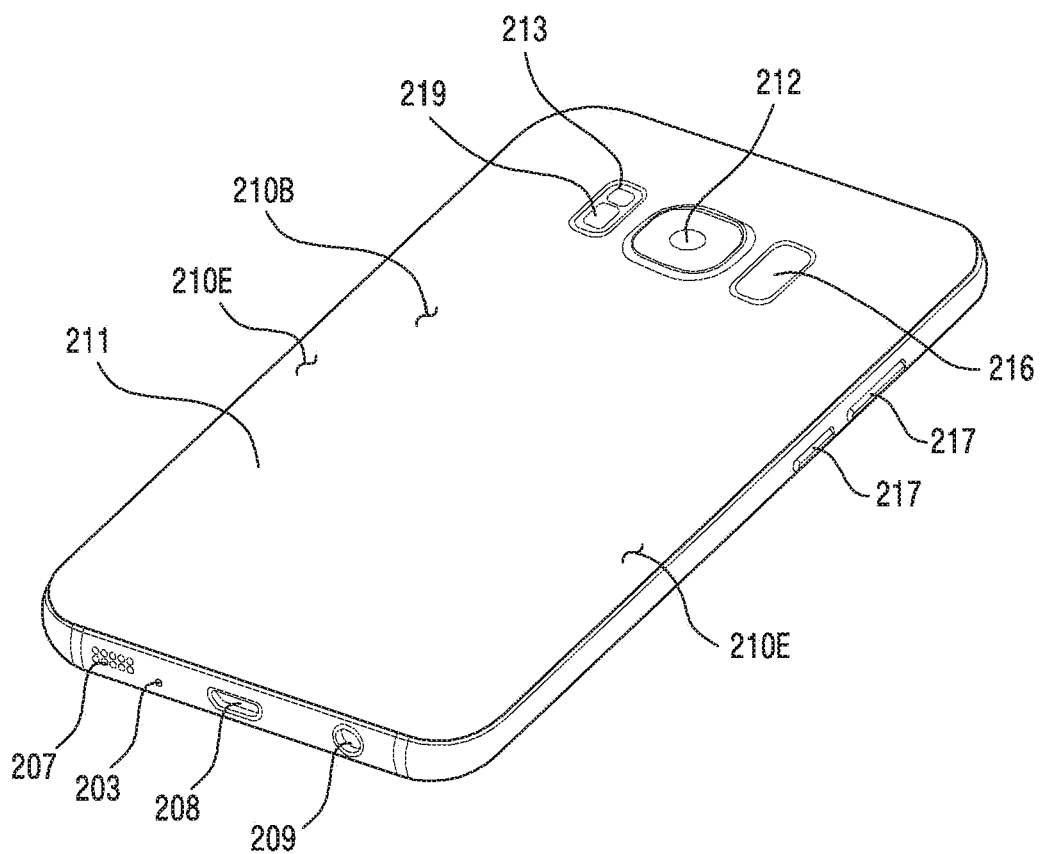
FIG. 2B is a rear perspective view of an electronic device of FIG. 2A according to an embodiment of the disclosure.

FIG. 2B is a rear perspective view of an electronic device of FIG. 2A according to various embodiments of the disclosure.

Referring to FIGS. 2A and 2B, an electronic device 200 according to an embodiment may include a housing 210 including a first face (or a front face) 210A, a second face (or a rear face) 210B, and a side face 210C surrounding a space between the first face 210A and the second face 210B. In another embodiment (not shown), the housing may refer to a structure which constitutes part of the first face 210A, second face 210B, and side face 210C of FIG. 2A. According to an embodiment, the first face 210A may be constructed of a front plate 202 (e.g., a polymer plate or a glass plate having various coating layers) which is at least partially transparent substantially. The second face 210B may be constructed of a rear plate 211 which is opaque substantially. For example, the rear plate 211 may be constructed of coated or colored glass, ceramic, polymer, metallic materials (e.g. aluminum, stainless steel (STS), or magnesium) or a combination of at least two of these materials. The side face 210C may be constructed of a side bezel structure (or a side member) 218 bonded to the front plate 202 and the rear plate 211 and including metal and/or polymer. In some embodiments, the rear plate 211 and the side bezel structure 218 may be constructed integrally and may include the same material (e.g., a metallic material such as aluminum).

In the illustrated embodiment, the front plate 202 may include two first regions 210D seamlessly extended by being bent from the first face 210A toward the rear plate 211 at both ends of a long edge of the front plate 202. In the illustrated embodiment (see FIG. 2B), the rear plate 211 may include two second regions 210E seamlessly extended by being bent from the second face 210B toward the front plate 202 at both ends of a long edge. In some embodiments, the front plate 202 (or the rear plate 211) may include only one of the first regions 210D (or the second regions 210E). In another embodiment, some of the first regions 210D or the second region 210E may not be included. In the above embodiments, in a side view of the electronic device 200, the side bezel structure 218 may have a first thickness (or width) at a side in which the first regions 210D or the second regions 210E is not included, and may have a second thickness thinner than the first thickness at a side in which the first regions 210D or the second regions 210E is included.

According to an embodiment, the electronic device 200 may include at least one of a display 201, audio modules 203, 207, and 214, sensor modules 204, 216, and 219, camera modules 205, 212, and 213, a key input device 217, a light emitting element 206, and connector holes 208 and 209. In some embodiments, the electronic device 200 may omit at least one of components (e.g., the key input device 217 or the light emitting element 206), or other components may be additionally included.

The display 201 may be exposed through, for example, some portions of the front plate 202. In some embodiments, at least part of the display 201 may be exposed through the first face 210A and the front plate 202 constructing the first regions 210D of the side face 210C. In some embodiments, a corner of the display 201 may be constructed to be substantially identical to an adjacent outer perimeter of the front plate 202. In another embodiment (not shown), a spacing between an outer perimeter of the display 201 and the outer perimeter of the front plate 202 may be constructed to be substantially identical in order to enlarge an area to which the display 201 is exposed.

In another embodiment (not shown), a recess or opening may be constructed in part of a screen display region of the display 201, and at least one of the audio module 214, the sensor module 204, and the camera module 205, and the light emitting element 206 may be included, which are aligned with the recess or the opening. In another embodiment (not shown), at least one of the audio module 214, the sensor module 204, the camera module 205, the sensor 216 (i.e., fingerprint sensor), and the light emitting element 206 may be included in a rear face of the screen display region of the display 201. In another embodiment (not shown), the display 201 may be disposed adjacent to or bonded to a touch sensing circuit, a pressure sensor capable of measuring touch strength (pressure), and/or a digitizer for detecting a magnetic-type stylus pen. In some embodiments, at least part of the sensor modules 204 and 219 and/or at least part of the key input device 217 may be disposed to the first regions 210D and/or the second regions 210E.

The audio modules 203, 207, and 214 may include the microphone hole (i.e., audio module 203) or the speaker holes (i.e., audio modules 207 and 214). A microphone for acquiring external sound may be disposed inside the microphone hole (i.e., audio module 203). In some embodiments, a plurality of microphones may be disposed to detect a direction of the sound. The speaker holes (i.e., audio modules 207 and 214) may include the external speaker hole (i.e., audio module 207) and the receiver hole (i.e., audio module 214) for a call. In some embodiments, the speaker holes (i.e., audio modules 207 and 214) and the microphone hole (i.e., audio module 203) may be implemented as one hole, or a speaker (e.g., a Piezo speaker) may be included without the speaker holes (i.e., audio modules 207 and 214).

The sensor modules 204, 216, and 219 may generate an electrical signal or data value corresponding to an internal operational state of the electronic device 200 or an external environmental state. The sensor modules 204, 216, and 219 may include, for example, the first sensor module 204 (e.g., a proximity sensor) and/or second sensor module (not shown) (e.g., a fingerprint sensor) disposed to the first face 210A of the housing 210, and/or the third sensor module 219 (e.g., a heart rate monitoring (HRM) sensor) disposed to the second face 210B of the housing 210 and/or the sensor module 216 (e.g., a fingerprint sensor). The fingerprint sensor may be disposed not only to the first face 210A but also the second face 210B of the housing 210. The electronic device 200 may further include at least one of senor modules (not shown), for example, a gesture sensor, a gyro sensor, an atmospheric pressure sensor, a magnetic sensor, an acceleration sensor, a grip sensor, a color sensor, an IR sensor, a biometric sensor, a temperature sensor, a humidity sensor, and an illuminance sensor.

The camera modules 205, 212, and 213 may include the first camera module 205 disposed to the first face 210A of the electronic device 200, the second camera module 212 disposed to the second face 210B, and/or the flash (i.e., camera module 213). The camera module 205 and 212 may include one or more lenses, an image sensor, and/or an image signal processor. The flash (i.e., camera module 213) may include, for example, a light emitting diode (LED) or a xenon lamp. In some embodiments, two or more lenses (infrared cameras, wide angle and telephoto lenses) and image sensors may be disposed to one face of the electronic device 200.

The key input device 217 may be disposed to the side face 210C of the housing 210. In another embodiment, the electronic device 200 may not include some or all of the aforementioned key input device 217. The key input device 217, which are not included, may be implemented on a display 201 in a different form such as a soft key or the like. In some embodiments, the key input device may include the sensor module 216 disposed to the second face 210B of the housing 210.

The light emitting element 206 may be disposed to, for example, the first face 210A of the housing 210. The light emitting element 206 may provide, for example, status information of the electronic device 200 in an optical form. In another embodiment, the light emitting element 206 may provide, for example, a light source interworking with an operation of the camera module 205. The light emitting element 206 may include, for example, an LED, an IR LED, and a xenon lamp.

The connector holes 208 and 209 may include the first connector hole 208 capable of accommodating a connector (e.g., a USB connector) for transmitting/receiving power and/or data of an external electronic device and/or the second connector hole (e.g., earphone jack) 209 capable of accommodating a connector for transmitting/receiving an audio signal with respect to the external electronic device.

Figure 2C:
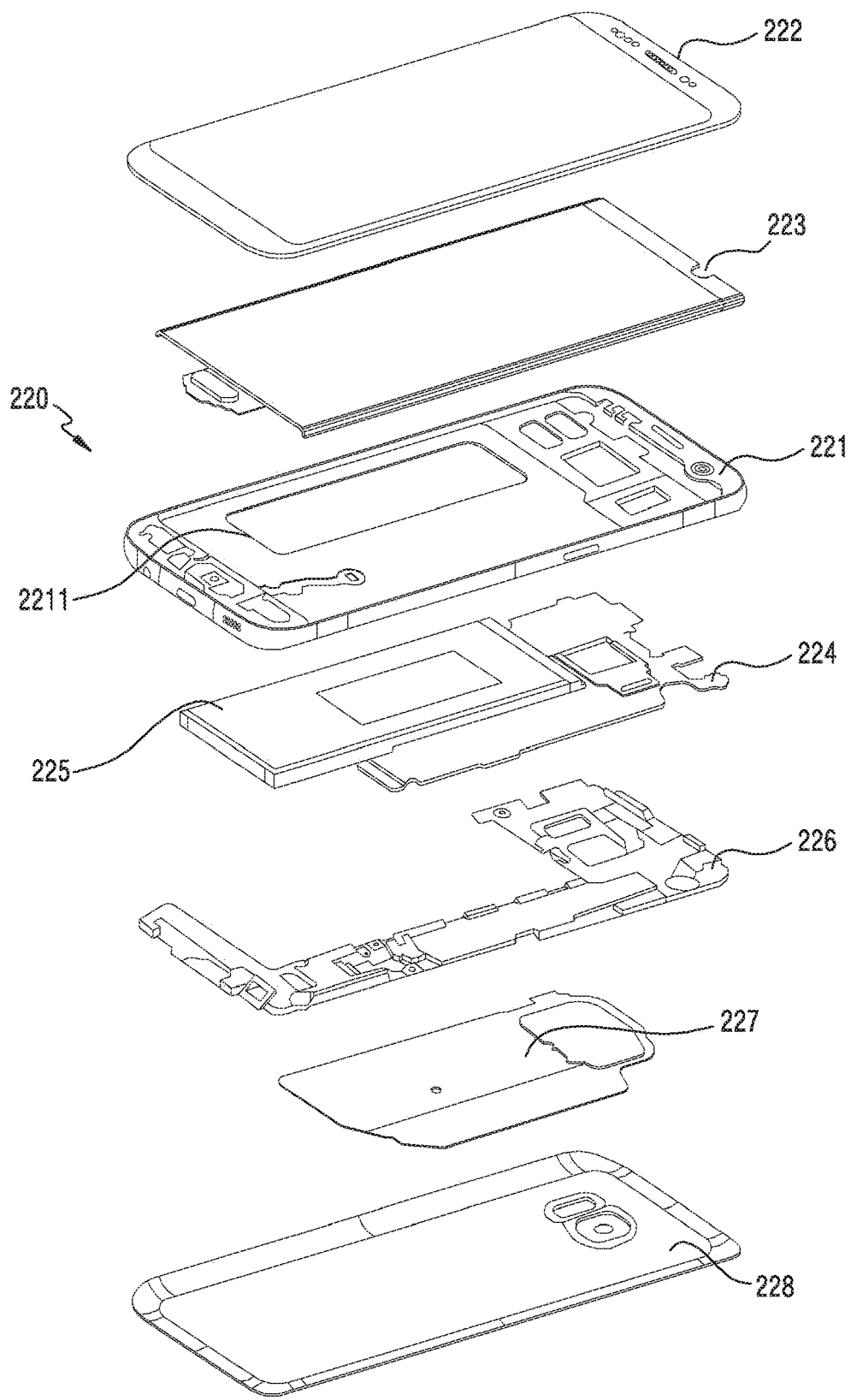
FIG. 2C is an exploded perspective view of an electronic device according to an embodiment of the disclosure.

FIG. 2C is an exploded perspective view of an electronic device according to an embodiment of the disclosure.

Referring to FIG. 2C, an electronic device 220 may include a side bezel structure 221, a first support member 2211 (e.g., a bracket), a front plate 222, a display 223, a PCB 224, a battery 225, a second support member 226 (e.g., a rear case), an antenna 227, and a rear plate 228. In some embodiments, the electronic device 220 may omit at least one (e.g., the first support member 2211 or the second support member 226) of these components, or may additionally include other components. At least one of the components of the electronic device 220 may be the same as or similar to at least one of the components of the electronic device 200 of FIG. 2A or 2B, and redundant descriptions will be omitted hereinafter.

A first support member 2211 may be coupled with the side bezel structure 221 by being disposed inside the electronic device 220, or may be integrated with the side bezel structure 221. The first support member 2211 may be constructed of, for example, a metal material and/or a non-metal (e.g., polymer) material. The first support member 2211 may have the display 223 coupled to one face and the PCB 224 coupled to the other face. A processor, a memory, and/or an interface may be mounted on the PCB 224. The processor may include, for example, one or more of a central processing unit, an application processor, a graphic processing unit, an image signal processor, a sensor hub processor, and a communication processor.

The memory may include, for example, a volatile memory or a non-volatile memory.

The interface may include, for example, a HDMI, a USB interface, an SD card interface, and/or an audio interface. The interface may electrically or physically couple, for example, the electronic device 220 with an external electronic device, and may include a USB connector, an SD card/multimedia card (MMC) connector, or an audio connector.

The battery 225 may be a device for supplying power to at least one component of the electronic device 220, and may include, for example, a primary cell which is not rechargeable, a secondary cell which is rechargeable, or a fuel cell. At least part of the battery 225 may be disposed, for example, to be substantially co-planar with the PCB 224. The battery 225 may be disposed inside the electronic device 220, and according to some embodiments, may be disposed to be detachable from the electronic device 220.

The antenna 227 may be disposed between the rear plate 228 and the battery 225. The antenna 227 may include, for example, a near field communication (NFC) antenna, a wireless charging antenna, and/or a magnetic secure transmission (MST) antenna. The antenna 227 may perform short-range communication, for example, with the external electronic device, or may wirelessly transmit/receive power required for charging. In another embodiment, an antenna structure may be constructed by at least part of the side bezel structure 221 and/or the first support member 2211 or a combination thereof.

Figure 3A:
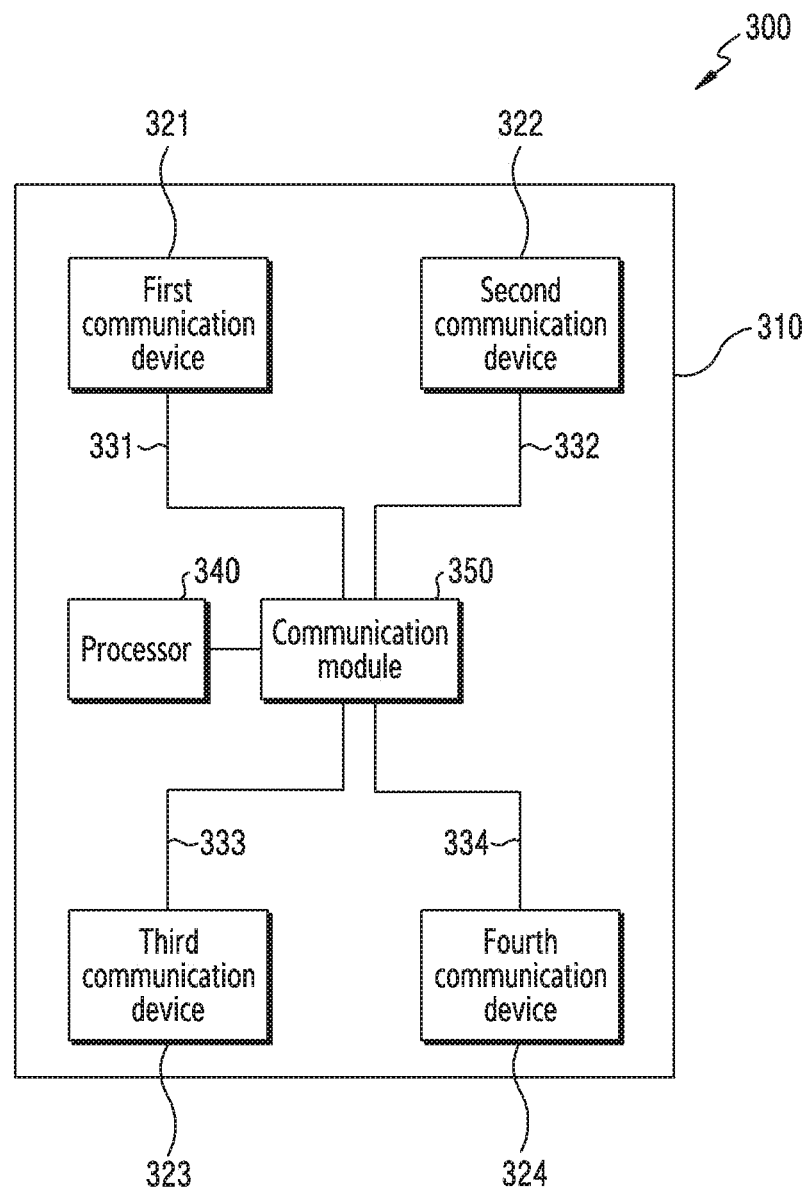
FIG. 3A illustrates an example of an electronic device supporting 5G communication according to an embodiment of the disclosure.

FIG. 3A illustrates an example of an electronic device supporting fifth generation (5G) communication according to an embodiment of the disclosure.

Referring to FIG. 3A, an electronic device 300 may include at least one of a housing 310, a processor 340, a communication module 350 (e.g., the communication module 190 of FIG. 1), a first communication device 321, a second communication device 322, a third communication device 323, a fourth communication device 324, a first conductive line 331, a second conductive line 332, a third conductive line 333, and a fourth conductive line 334.

According to an embodiment, the housing 310 may protect different components of the electronic device 300. The housing 310 may include, for example, a front plate, a back plate facing away from the front plate, and a side member (or a metal frame) attached to the back plate or formed integrally with the back plate and surrounding a space between the front plate and the back plate.

According to an embodiment, the electronic device 300 may include at least one of the first communication device 321, the second communication device 322, the third communication device 323, and the fourth communication device 324.

According to an embodiment, the first communication device 321, the second communication device 322, the third communication device 323, or the fourth communication device 324 may be located inside the housing 310. According to an embodiment, when viewed from above the back plate of the electronic device, the first communication device 321 may be disposed to a left upper end of the electronic device 300, the second communication device 322 may be disposed to a right upper end of the electronic device 300, the third communication device 323 may be disposed to a left lower end of the electronic device 300, and the fourth communication device 324 may be disposed to a right lower end of the electronic device 300.

According to an embodiment, the processor 340 may include one or more of a central processing unit, a GPU, an image signal processor of a camera, and a baseband processor (or a CP). According to an embodiment, the processor 340 may be implemented as a system on chip (SoC) or a system in package (SIP).

According to an embodiment, the communication module 350 may be electrically coupled to the first communication device 321, the second communication device 322, the third communication device 323, and the fourth communication device 324 by using the first conductive line 331, the second conductive line 332, the third conductive line 333, or the fourth conductive line 334. The communication unit 350 may include, for example, a baseband processor or at least one communication circuit (e.g., intermediate frequency integrated circuit (IFIC) or RFIC). The communication module 350 may include, for example, a baseband processor separate from the processor 340 (e.g., an AP. The first conductive line 331, the second conductive line 332, the third conductive line, or the fourth conductive line 334 may include, for example, a coaxial cable or a flexible circuit board (FPCB).

According to an embodiment, the communication module 350 may include a first baseband processor (BP) (not shown) or a second BP (not shown). The electronic device 300 may further include one or more interfaces between the first BP (or the second BP) and the processor 340 to support communication between chips. The processor 340 and the first BP or the second BP may transmit or receive data by using the interface between the chips (i.e., an inter-processor communication channel).

According to an embodiment, the first BP or the second BP may provide an interface for performing communication with different entities. The first BP may support wireless communication, for example, for a first network (not shown). The second BP may support wireless communication, for example, for a second network (not shown).

According to an embodiment, the first BP or the second BP may form one module together with the processor 340. For example, the first BP or the second BP may be integrally formed together with the processor 340. For another example, the first BP or the second BP may be disposed inside one chip, or may be formed as an independent chip. According to an embodiment, the processor 340 and at least one BP (e.g. the first BP) may be integrally formed inside one chip (SoC chip), and another BP (e.g., the second BP) may be formed as an independent chip.

According to an embodiment, the first network (not shown) or the second network (not shown) may correspond to the network 199 of FIG. 1. According to an embodiment, each of the first network (not shown) and the second network (not shown) may include a 4th Generation (4G) network and a 5G network. The 4G network may support, for example, a long term evolution (LTE) protocol defined in third generation partnership project (3GPP). The 5G network may support, for example, a new radio (NR) protocol defined in 3GPP.

Figure 3B:
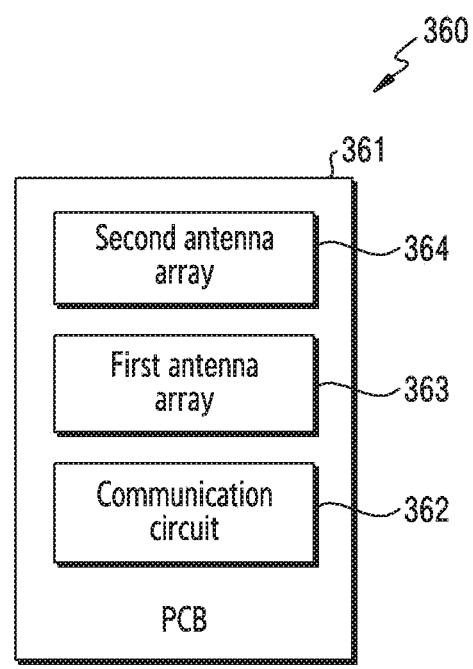
FIG. 3B is a block diagram of a communication device according to an embodiment of the disclosure.

FIG. 3B is a block diagram of a communication device according to an embodiment of the disclosure.

Referring to FIG. 3B, a communication device 360 (e.g., the first communication device 321, second communication device 322, third communication device 323, and fourth communication device 324 of FIG. 3A) may include at least one of a communication circuit 362 (e.g., RFIC), a PCB 361, a first antenna array 363, and a second antenna array 364.

According to an embodiment, at least one of the communication circuit 362, the first antenna array 363, and the second antenna array 364 may be located in the PCB 361. For example, the first antenna array 363 or the second antenna array 364 may be disposed to a first face of the PCB 361, and the communication circuit 362 may be disposed to a second face of the PCB 361. The PCB 361 may include a connector (e.g., a coaxial cable connector or a board to board (B-to-B) connector) so as to be electrically coupled to another PCB (e.g., a PCB on which the communication module 350 of FIG. 3A is disposed) by using a transmission line (e.g., the first conductive line 331 of FIG. 3A, a coaxial cable). The PCB 361 may be coupled to a PCB having the communication module 350 disposed thereon through a coaxial cable by using, for example, the coaxial cable connector, and the coaxial cable may be used to transfer transmission and reception IF signals or RF signals. For another example, power or other control signals may be transferred through the B-to-B connector.

According to an embodiment, the first antenna array 363 or the second antenna array 364 may include a plurality of antennas. The antenna may include, for example, a patch antenna, a loop antenna, or a dipole antenna. For example, at least part of the plurality of antennas included in the first antenna array 363 may be a patch antenna to form a beam towards the back plate of the electronic device 300. For another example, at least part of the plurality of antennas included in the second antenna array 364 may be a dipole antenna or a loop antenna to form a beam towards the side member of the electronic device 300.

According to an embodiment, the communication circuit 362 may support at least some bands (e.g., 24 GHZ to 30 GHZ or 37 GHz to 40 GHz) among bands in the range of 6 GHz to 100 GHz. According to an embodiment, the communication circuit 362 may up-convert or down-convert frequencies. For example, the communication circuit 362 included in the communication device 360 (e.g., the first communication device 321 of FIG. 3A) may up-convert an IF signal received through a conductive line (e.g., the first conductive line 331 of FIG. 3A) from the communication module (e.g., the communication module 350 of FIG. 3A) into an RF signal. For another example, the communication circuit 362 included in the communication device 360 (e.g., the first communication device 321 of FIG. 3A) may down-convert an RF signal (e.g., a millimeter wave signal) received through the first antenna array 363 or the second antenna array 364 into an IF signal, and may transmit the signal to the communication module by using the conductive line.

Figure 4A:
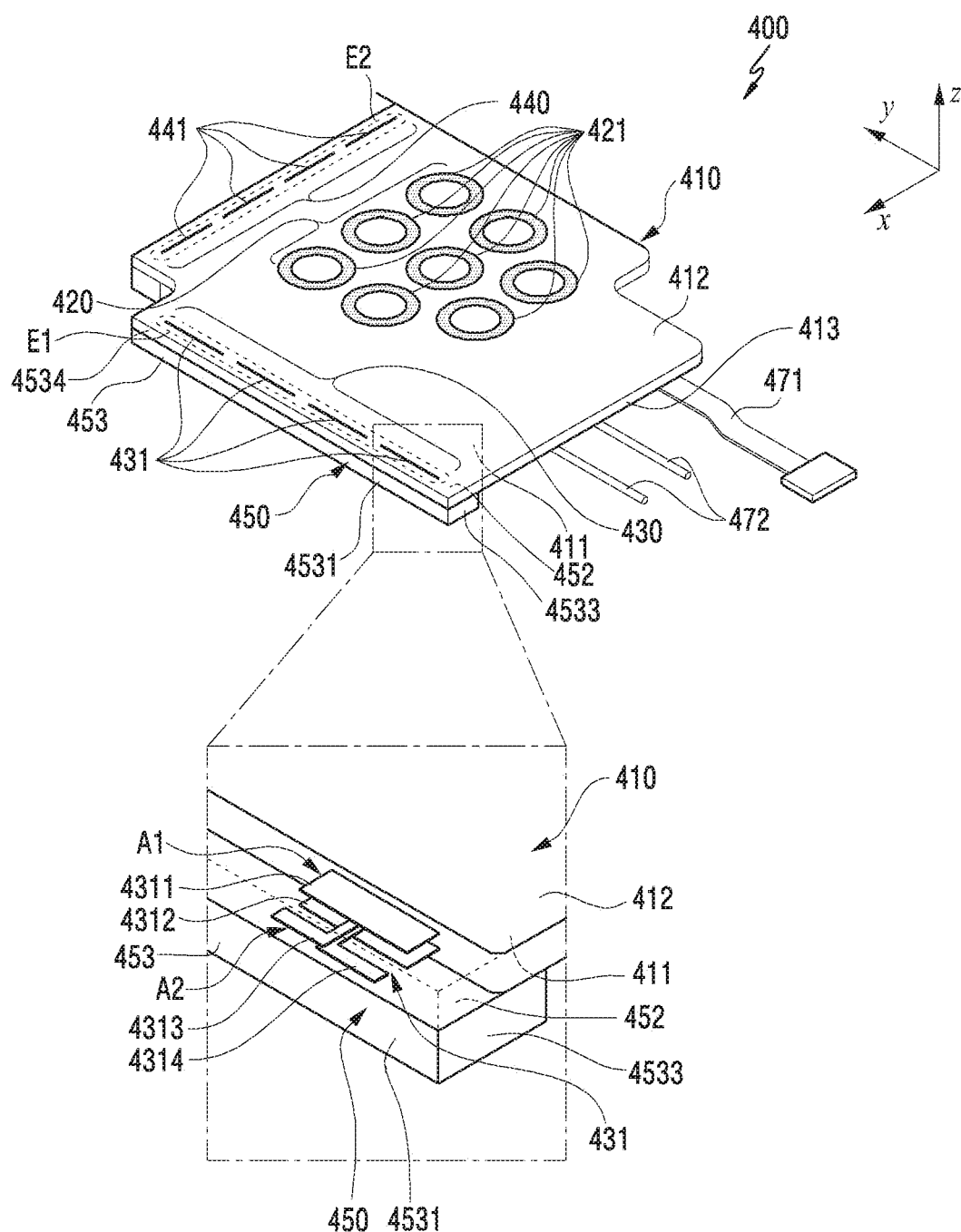
FIG. 4A is a perspective view of a communication device according to an embodiment of the disclosure.
Figure 4B:
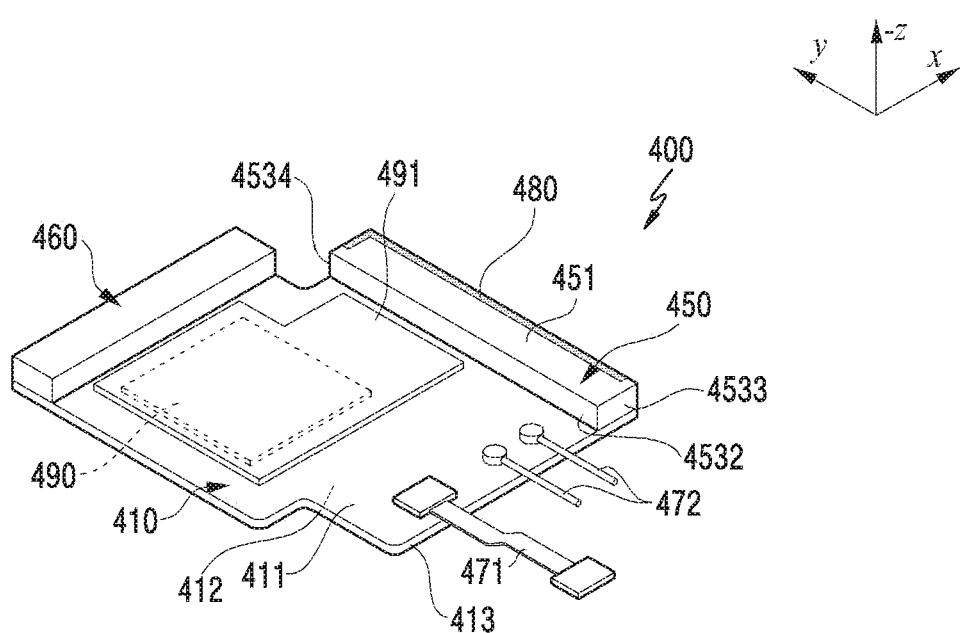
FIG. 4B is a perspective view of a communication device according to an embodiment of the disclosure.

FIGS. 4A and 4B are perspective views of a communication device 400 according to various embodiments of the disclosure.

The communication device 400 of FIGS. 4A and 4B may be at least in part similar to the communication devices 321, 322, 323, and 324 of FIG. 3A or the communication device 360 of FIG. 3B, or may include other embodiments of the communication device.

Referring to FIGS. 4A and 4B, the communication device 400 may include a substrate 410. According to an embodiment, the substrate 410 may include a first substrate face 411, a second substrate face 412 facing away from the first substrate face 411, a substrate side face 413 surrounding a space between the first substrate face 411 and the second substrate face 412. According to an embodiment, the substrate 410 may be disposed such that the second substrate face 412 faces a back plate (e.g., the rear plate 211 of FIG. 2B) of the electronic device (e.g., the electronic device 200 of FIG. 2B). In another embodiment, the second substrate face 412 of the substrate 410 may be disposed to face a side member (e.g., the side bezel structure 218 of FIG. 2A) or a front plate (e.g., the front plate 202 of FIG. 2A) of the electronic device.

According to various embodiments, the communication device 400 may include at least one of a first antenna array 420, second antenna array 430, and third antenna array 440 disposed to the substrate 410. According to an embodiment, the first antenna array 420 may be disposed such that a beam pattern is formed in a z-axis direction through the second substrate face 412 of the substrate 410. According to an embodiment, the second antenna array 430 may be disposed such that a beam pattern is formed in an x-axis direction in a first edge region E1 of the substrate 410. According to an embodiment, the third antenna array 440 may be disposed to be adjacent to the second antenna array 430, and may be disposed such that a beam pattern is formed in a y-axis direction in a second edge region E2 of the substrate 410.

According to various embodiments, the first antenna array 420 may include a plurality of first unit antennas 421 disposed with a specific interval to the second substrate face 412 of the substrate 410. The plurality of first unit antennas 421 may include an antenna element constructed in the form or a metal patch or a conductive pattern. According to an embodiment, the second antenna array 430 may include a plurality of second unit antennas 431 disposed with a specific antenna to the first edge region E1 in the second substrate face 412 of the substrate 410. According to an embodiment, the third antenna array 440 may include a plurality of third unit antennas 441 disposed with a specific interval in the second edge region E2 in the second substrate face 412 of the substrate 410.

According to various embodiments, the communication device 400 may include a first wireless communication circuit 490 mounted on the first substrate face 411 of the substrate 410 and electrically coupled to the antenna arrays 420, 430, and 440. According to an embodiment, the first wireless communication circuit 490 may be configured to transmit/receive a signal having a frequency band in the range of 6 GHz to 100 GHz through the plurality of antenna arrays 420, 430, and 440.

According to various embodiments, each of the plurality of second unit antennas 431 of the second antenna array 430 may include a first antenna A1 and a second antenna A2. According to an embodiment, the first antenna A1 may include a first antenna element 4311 and a second antenna element 4312. According to an embodiment, when viewed from above the second substrate face 412 of the substrate 410, the first antenna element 4311 and the second antenna element 4312 may be disposed to be spaced apart with a specific interval at a location where at least some regions overlap with each other. According to an embodiment, the first wireless communication circuit 490 may transmit/receive a vertically polarized wave through the first antenna element 4311 and the second antenna element 4312. According to an embodiment, the first antenna element 4311 and the second antenna element 4312 may be constructed in the form of a metal plate or metal patch. According to an embodiment, a second antenna A2 may include the third antenna element 4313 and the fourth antenna element 4314. According to an embodiment, the third antenna element 4313 and the fourth antenna element 4314 may be disposed in parallel, and may be disposed to a space between the first antenna element 4311 and the second antenna element 4312. According to an embodiment, the first wireless communication circuit 490 may transmit/receive a horizontally polarized wave through the third antenna element 4313 and the fourth antenna element 4314. According to an embodiment, the third antenna element 4313 and the fourth antenna element 4314 may be constructed in the substrate 410 as a dipole radiator in the form of a metal pattern. For example, each of the plurality of third unit antennas 441 of the third antenna array 440 may be constructed to have substantially the same structure as the aforementioned second unit antenna 431.

According to various embodiments, the communication device 400 may include a shield can 491 disposed to surround the first wireless communication circuit 490 in order to shield a noise after being mounted on the first substrate face 411 of the substrate 410. According to an embodiment, the communication device 400 may include at least one electrical coupling member to be electrically coupled to a PCB (e.g., a PCB 520 of FIG. 5A) of the electronic device through at least some regions of the substrate 410. According to an embodiment, the electrical coupling member may include an FPCB 471 or a coaxial cable 472. According to an embodiment, although it is illustrated that the electrical coupling member is split into two or more elements, the electrical coupling member may also be constructed together with one FPCB.

According to various embodiments, the communication device 400 may include a first dielectric structure 450 or second dielectric structure 460 disposed to the first substrate face 411 of the substrate 410 to have a thickness. According to an embodiment, the dielectric structures 450 and 460 may include the first dielectric structure 450 disposed to the first substrate face 411 to at least partially overlap with the first edge region E1 of the substrate 410 and the second dielectric structure 460 disposed to the first substrate face 411 to at least partially overlap with the second edge region E2 of the substrate 410. According to an embodiment, the first dielectric structure 450 and the second dielectric structure 460 may be disposed through the first substrate face 411 and substrate side face 413 of the substrate 410. According to an embodiment, the first dielectric structure 450 may be disposed at a location at least partially overlapping with the second antenna array 430, and the second dielectric structure 460 may be disposed at a location at least partially overlapping with the third antenna array 440. According to an embodiment, the first dielectric structure 450 and/or the second dielectric structure 460 may be constructed to have a greater thickness than the substrate 410. According to an embodiment, the first dielectric structure 450 and/or the second dielectric structure 460 may be constructed of the same material (FR4) of the substrate 410 or may be constructed of a polymer material. According to an embodiment, the first dielectric structure 450 and/or the second dielectric structure 460 may be attached to the substrate through an adhesive member. According to an embodiment, the first dielectric structure 450 and the second dielectric structure 460 may mitigate distortion of a signal radiated from the second antenna array 430 and the third antenna array 440. For example, the first dielectric structure 450 and the second dielectric structure 460 may mitigate a null region (e.g., a region in which a size of a beam pattern is decreased) which is present at a contact point of a front plate (e.g., the front plate 202 of FIG. 2A) of an electronic device (e.g., the electronic device 200 of FIG. 2A) having a different permittivity and a housing (e.g., the housing 210 of FIG. 2A) or a back plate (e.g., the rear plate 211 of FIG. 2A) and the housing.

According to various embodiments, the first dielectric structure 450 may be constructed in a rectangular shape along a lengthwise direction of the first edge region E1. According to an embodiment, the first dielectric structure 450 may include a first face 451 facing the same direction as the first substrate face 411, a second face 452 facing the same direction as the second substrate face 412 of the substrate 410, and a side face 453 surrounding the first face 451 and the second face 452. According to an embodiment, the side face 453 may include a first side face 4531 facing an outer direction of the substrate 410, a second side face 4532 facing an inner direction of the substrate 410, a third side face 4533 coupling the first side face 4531 and one end of the second side face 4532, and a fourth side face 4534 coupling the first side face 4531 and another end of the second side face 4532. According to an embodiment, a first conductive pattern 480 may be disposed to at least some regions of the first dielectric structure 450. According to an embodiment, the first conductive pattern 480 may include a conductive pattern constructed using a conductive plate attached to the first dielectric structure 450, a conductive paint coated on the first dielectric structure 450, or laser direct structuring (LDS) in the first dielectric structure 450. According to an embodiment, the first conductive pattern 480 may be disposed to the first face 451 of the first dielectric structure 450. According to an embodiment, the first conductive pattern 480 may be electrically coupled to a second wireless communication circuit (e.g., the second wireless communication circuit 521) mounted to a PCB (e.g., the PCB 520 of FIG. 5A) of the electronic device. According to an embodiment, the second wireless communication circuit (e.g., the second wireless communication circuit 521 of FIG. 5B) may transmit/receive a signal having a frequency in a specific range through the first conductive pattern 480. According to an embodiment, the second wireless communication circuit (e.g., the second wireless communication circuit 521 of FIG. 5B) may transmit/receive a signal having a frequency in the range of 0.5 GHz to 6 GHz through the first conductive pattern 480.

In an embodiment, the communication device 400 may include the FPCB 471 utilized so as to be electrically coupled to another PCB (e.g., the PCB 520 of FIG. 5) or a coaxial cable 472 for various other electrical coupling or supporting.

Figure 5A:
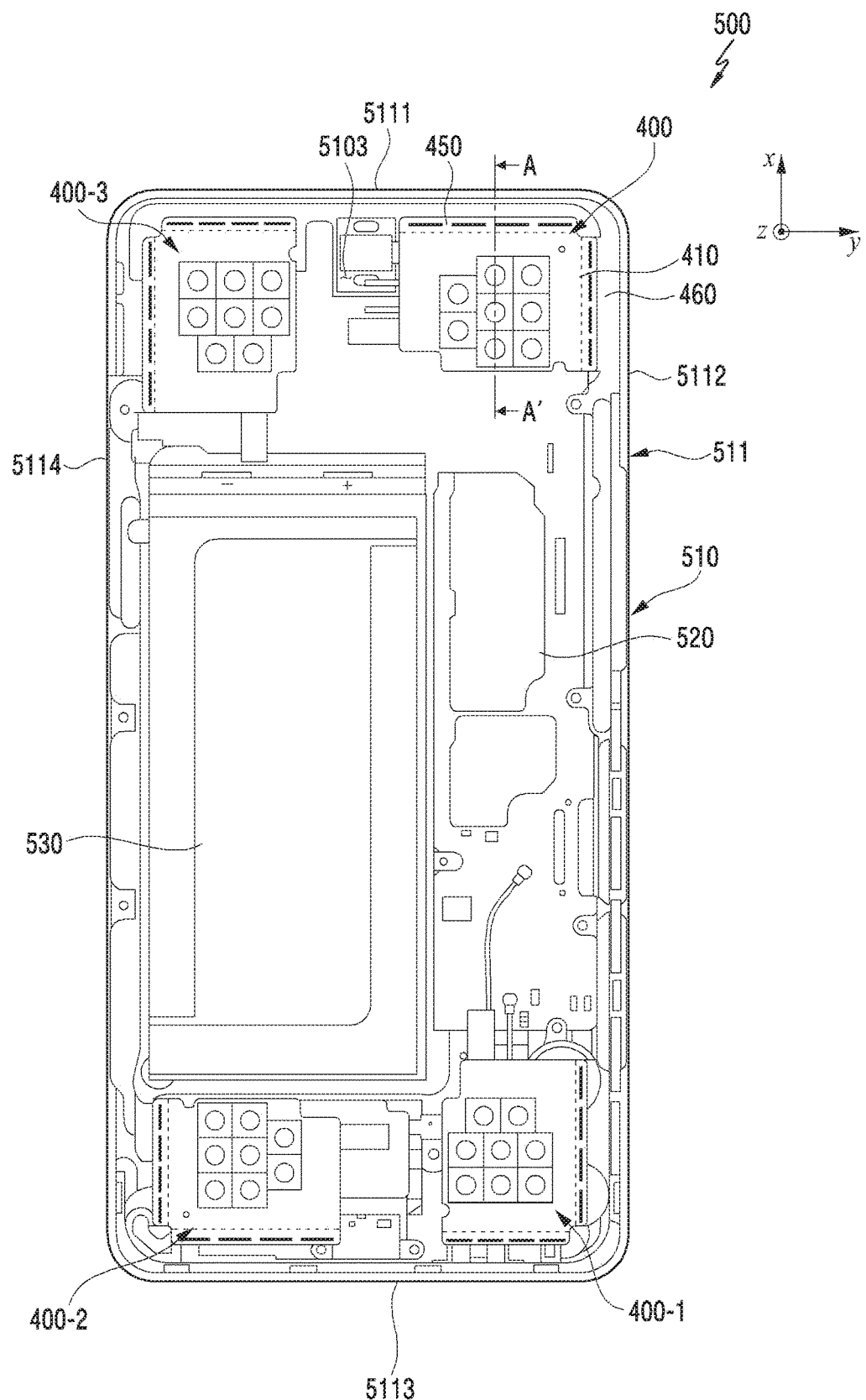
FIG. 5A illustrates an electronic device to which a communication device is disposed according to an embodiment of the disclosure.

FIG. 5A illustrates an electronic device 500 to which the communication devices 400, 400-1, 400-2, and 400-3 are disposed according to an embodiment of the disclosure.

The electronic device 500 of FIG. 5A may be at least in part similar to the electronic device 101 of FIG. 1 and the electronic device 200 of FIG. 2A, or may include other embodiments of the electronic device.

Referring to FIG. 5A, the electronic device 500 may include a housing 510. According to an embodiment, the housing 510 may include a side member 511. According to an embodiment, at least some regions of the side member 511 may be constructed of a conductive member. According to an embodiment, the side member 511 may include a first portion 5111 having a first length, a second portion 5112 having a second length extended in a vertical direction from the first portion 5111, a third portion 5113 extended from the second portion 5112 to have the first length in parallel with the first portion 5111, and a fourth portion 5114 extended from the third portion 5113 to have the second length in parallel with the second portion 5112.

According to various embodiments, the communication devices 400, 400-1, 400-2, and 400-3 may be disposed to an inner space 5103 of the electronic device 500. According to an embodiment, the communication devices 400, 400-1, 400-2, and 400-3 may have substantially the same structure as the communication device 400 of FIG. 4A and FIG. 4B. According to an embodiment, at least one of the communication devices 400, 400-1, 400-2, and 400-3 may be disposed at a location overlapping or not overlapping with the PCB 520 (e.g., a main PCB) of the electronic device 500. According to an embodiment, the PCB 520 may be disposed by avoiding a battery 530 of the electronic device 500. At least one of the communication devices 400, 400-1, 400-2, and 400-3 may be disposed not to overlap, or at least partially overlap, with the battery 530 and/or the PCB 520. According to an embodiment, at least one of the communication devices 400, 400-1, 400-2, and 400-3 may be disposed to at least one substantially rectangular shaped corner portion of the electronic device 500. In another embodiment, at least one of the communication devices 400, 400-1, 400-2, and 400-3 may be disposed to an edge which is not the corner of the electronic device 500 or to the corner and the edge in combination.

According to various embodiments, the first communication device 400 may be disposed such that a beam pattern of the first antenna array 420 faces a back plate (e.g., the rear plate 211 of FIG. 2A) of the electronic device 500 (e.g., faces a z-direction). According to an embodiment, the first communication device 400 may be disposed such that a beam pattern of the second antenna array 430 faces the first portion 5111 of the electronic device 500. According to an embodiment, the first communication device 400 may be disposed such that a beam pattern of the third antenna array 440 faces the second portion 5112 of the electronic device 500. In this case, the first dielectric structure 450 and second dielectric structure 460 of the first communication device 400 may be disposed between the substrate 410 and the PCB 520 of the electronic device 500 or may be disposed between the substrate 410 and the housing 510 of the electronic device 500. In another embodiment, the first dielectric structure 450 and/or second dielectric structure 460 of the first communication device 400 may be disposed to have an additional support structure between the substrate 410 and the PCB 520 or housing 510 of the electronic device 500.

Figure 5B:
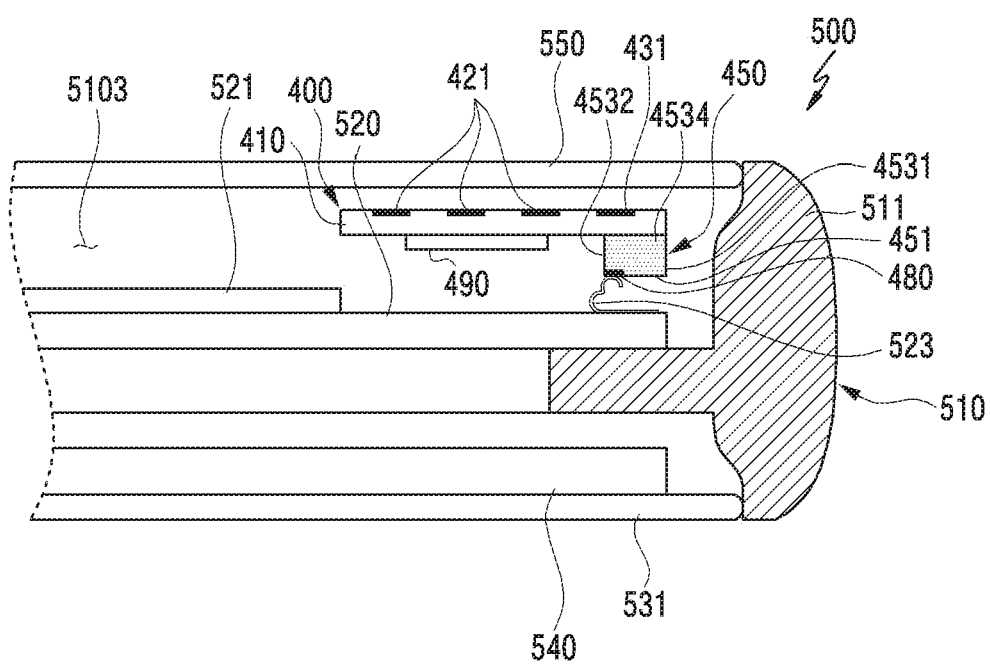
FIG. 5B is a cross-sectional view illustrating a main part of an electronic device to which a communication device is disposed according to an embodiment of the disclosure.

FIG. 5B is a cross-sectional view illustrating a main part of an electronic device to which a communication device is disposed according to an embodiment of the disclosure. FIG. 5B is a cross-sectional view, taken along the line A-A' of FIG. 5A.

The electronic device 500 of FIG. 5B may be at least in part similarly to the electronic device 101 of FIG. 1 and the electronic device 200 of FIG. 2A, or may include other embodiments of the electronic device.

Referring to FIG. 5B, the electronic device 500 may include the housing 510 including the first plate 531 (e.g., the front plate 222 of FIG. 2C), a second plate 550 (e.g., the rear plate 228 of FIG. 2C) facing away from the first plate 531, and the side member 511 (e.g., the side bezel structure 221 of FIG. 2C) surrounding the space 5103 between the first plate 531 and the second plate 550. According to an embodiment, the electronic device 500 may include a display 540 disposed to be visually exposed at least partially through the first plate 531 in the space 5103. According to an embodiment, the electronic device 500 may include the PCB 520 (e.g., the PCB 224 of FIG. 2C) disposed inside the space 5103 and disposed in parallel with the first plate 531. According to an embodiment, the PCB 520 may include a second wireless communication circuit 521. According to an embodiment, the electronic device 500 may include the communication device 400 disposed between the PCB 520 and the second plate 550.

According to an embodiment, the communication device 400 may include the substrate 410, and may include the first dielectric structure 450 disposed to one end of the substrate 410 between the substrate 410 and the side member 511. According to an embodiment, the first conductive pattern 480 may be constructed inside the first dielectric structure 450 or on the first face 451 of the first dielectric structure 450. In another embodiment, the first conductive pattern 480 may be constructed on the first side face 4531, second side face 4532, and third side face (e.g., the third side face 4533 or fourth side face 4534 of FIG. 4A) of the first dielectric structure 450. According to an embodiment, the first conductive pattern 480 may be electrically coupled with the PCB 520 by means of an electrical coupling member 523. According to an embodiment, the electrical coupling member 523 may include a C-clip, a conductive pin, a conductive tape, a conductive form, or a conductive connector. According to an embodiment, the first conductive pattern 480 may be electrically coupled to the second wireless communication circuit 521 mounted to the PCB 520.

In various embodiments, a contact point or contact region between the first conductive pattern 480 and the electrical coupling member 523 (e.g., a flexible conductive member) may not overlap with a dipole antenna (e.g., the second unit antennas 431 of FIG. 4A), when viewed from above the second plate 550.

According to various embodiments, the first conductive pattern 480 may have a structure of being electrically coupled to the PCB 520 by using an operation in which the electronic device 500 is mounted to an inner space 5103. According to an embodiment, the first wireless communication circuit 490 mounted to the substrate 410 of the communication device 400 may transmit/receive a first signal having a frequency in a first range through a first antenna array (e.g., the first antenna array 420 of FIG. 4A), second antenna array (e.g., the second antenna array 430 of FIG. 4A), and third antenna array (e.g., the third antenna array 440 of FIG. 4A) disposed to the communication device 400. According to an embodiment, the first wireless communication circuit 490 may transmit/receive a signal having a frequency in the range of 6 GHz to 100 GHz. According to an embodiment, the second wireless communication circuit 521 mounted to the PCB 520 may transmit/receive a second signal having a frequency in a second range through the first conductive pattern 480 disposed to the first dielectric structure 450 of the communication device 400. According to an embodiment, the second wireless communication circuit 521 may transmit/receive a signal having a frequency in the range of 0.5 GHz to 6 GHz.

Figure 6A:
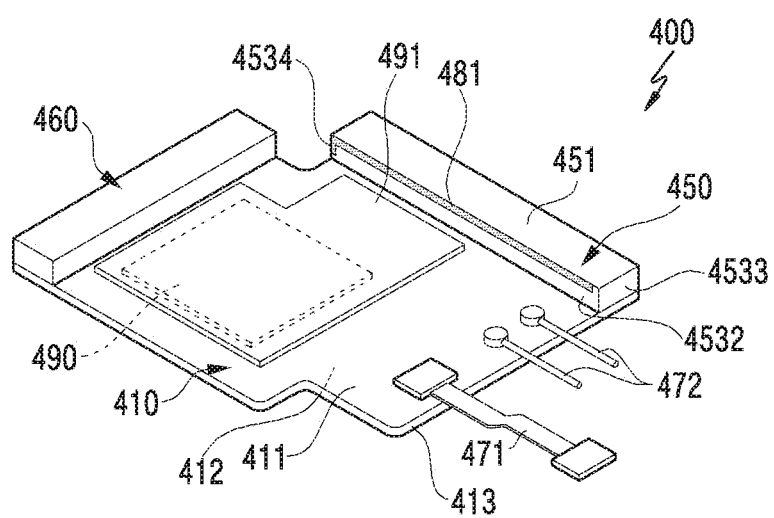
FIG. 6A is a perspective view illustrating a state where a conductive pattern is disposed to a communication device according to an embodiment of the disclosure.
Figure 6B:
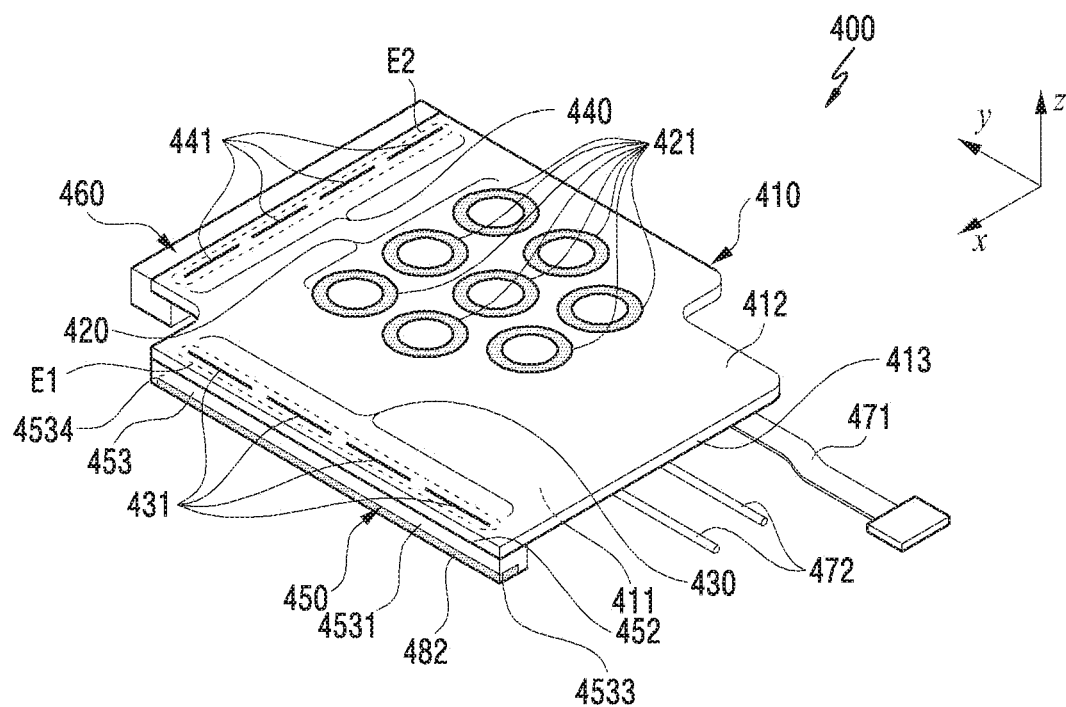
FIG. 6B is a perspective view illustrating a state where a conductive pattern is disposed to a communication device according to an embodiment of the disclosure.
Figure 6C:
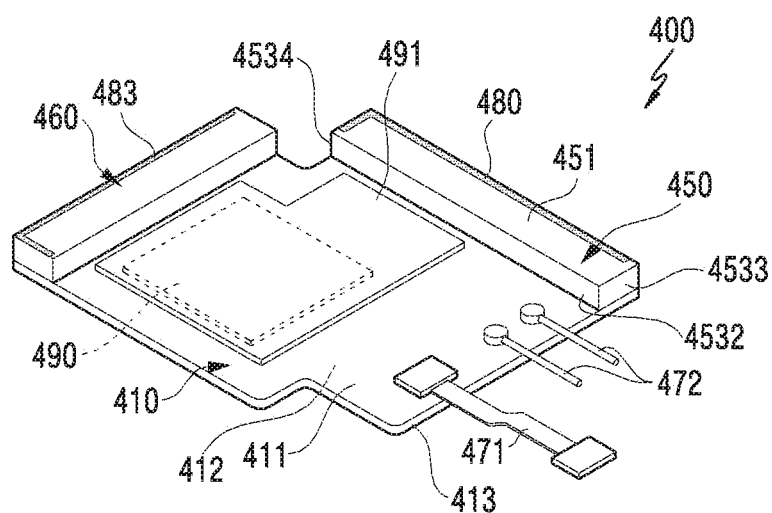
FIG. 6C is a perspective view illustrating a state where a conductive pattern is disposed to a communication device according to an embodiment of the disclosure.

FIGS. 6A, 6B and 6C are perspective views illustrating a state where a conductive pattern is disposed to a communication device according to various embodiments of the disclosure.

According to an embodiment, a conductive pattern 481 may be disposed at various locations of the first dielectric structure 450 capable of being electrically coupled to a PCB (e.g., the PCB of FIG. 5B) of the electronic device (e.g., the electronic device 500 of FIG. 5B). According to an embodiment, the conductive pattern 481 may be disposed at a location where interference with a second antenna array (e.g., the second antenna array 430 of FIG. 4A) disposed in the vicinity of the first dielectric structure 450 satisfies a designated condition.

Referring to FIG. 6A, the conductive pattern 481 may be disposed to the second side face 4532 of the first dielectric structure 450.

Referring to FIG. 6B, a conductive pattern 482 may be disposed to the first side face 4531 of the first dielectric structure 450. According to an embodiment, the conductive pattern 482 may be disposed to be extended from the first side face 4531 to up to at least part of the third side face 4533. In another embodiment, the conductive pattern 482 may be disposed to be extended by using at least two faces among the first face 451, second face 452, first side face 4531, second side face 4532, third side face 4533, and fourth side face 4534 of the first dielectric structure 450. In another embodiment, although not shown, at least two conductive patterns (e.g., the conductive pattern 482 of FIG. 6B) may be disposed in the same or different shapes to respectively at least two faces among the first face 451, second face 452, first side face 4531, second side face 4532, third side face 4533, and fourth side face 4534. In this case, each conductive pattern may be electrically coupled to a second wireless communication circuit (e.g., the second wireless communication circuit 521 of FIG. 5B) of a PCB (e.g., the PCB 520 of FIG. 5B).

Referring to FIG. 6B, at least part of a dielectric structure (e.g., the second dielectric structure 460 of FIG. 6B) may be coupled to the substrate 410 to protrude with respect to a side portion of the substrate 410 (e.g., the substrate 410 of FIG. 4A). For example, the second dielectric structure 460 may include a second face (e.g., the second face 452 of FIG. 4A) facing the second substrate face 412 at the first substrate face 411, and the substrate 410 may be coupled to some regions (hereinafter, a first region) of the second face in an overlapping manner. In various embodiments, referring to FIG. 6B, in the second face of the second dielectric structure 460, the first region coupled to face the first substrate face 411 of the substrate 410 may be constructed to have a height different from another second region of the second face. For example, compared to the second region, the first region may be disposed to be less spaced apart from a first face (e.g., the first face 451 of FIG. 4A). According to an embodiment, when the substrate 410 is disposed to the first region of the second dielectric structure 460, the first region may partially cover the first substrate face 411 of the substrate 410a, and a third region connecting the first and second regions having different heights may partially cover a side face (e.g., a face surrounding the first substrate face 411 and the second substrate face 412) of the substrate 410. According to an embodiment, the second region of the second dielectric structure 460 may not protrude with respect to the second substrate face 412 of the substrate 410. According to some embodiments, the second region of the second dielectric structure 460 may protrude with respect to the second substrate face 412 of the substrate 410. According to various embodiments, an adhesive member may be disposed between the third region connecting the first and second regions having different heights and the side face of the substrate 410. According to various embodiments, although not shown, a mutual structure between the second dielectric structure 460 and the substrate 410 may also be applied to a mutual structure between the first dielectric structure 450 and the substrate 410.

Referring to FIG. 6C, the conductive patterns 480 and 483 may include the first conductive pattern 480 disposed to the first dielectric structure 450 and the second conductive pattern 483 disposed to the second dielectric structure 460. In this case, the first conductive pattern 480 and the second conductive pattern 483 may be electrically coupled to a second wireless communication circuit (e.g., the second wireless communication circuit 521 of FIG. 5B) of a PCB (e.g., the PCB 520 of FIG. 5B), and the second wireless communication circuit (e.g., the second wireless communication circuit 521 of FIG. 5B) may transmit/receive a signal in a different frequency range through the first conductive pattern 480 and the second conductive pattern 483.

Figure 7A:
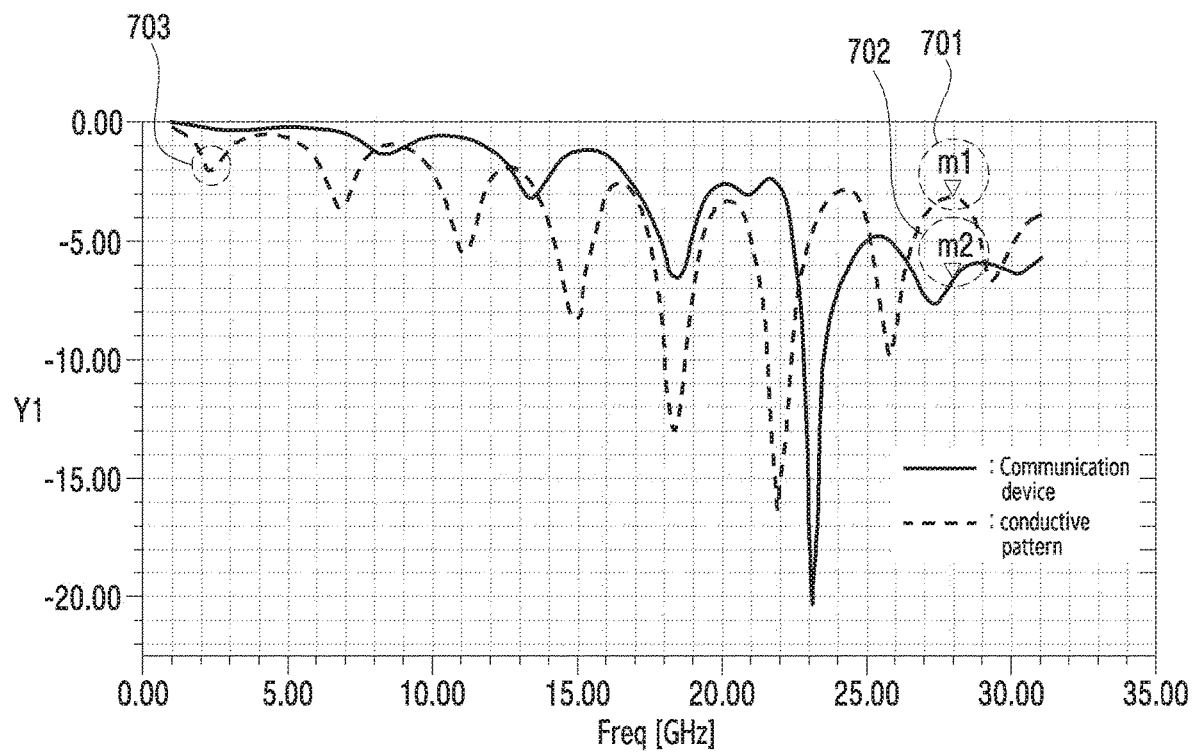
FIG. 7A is an S11 graph of a communication device to which a conductive pattern is disposed according to an embodiment of the disclosure.

FIG. 7A is an S11 graph of a communication device to which a conductive pattern is disposed according to an embodiment of the disclosure.

Referring to FIG. 7A, the S11 graph of the communication device 400 is shown for a case where the conductive pattern 480 operating as a Wi-Fi antenna of FIG. 4B is disposed to the first face 451 of the first dielectric structure 450, and it can be seen that, while the conductive pattern 480 smoothly operates at a desired frequency band (a region 703) (e.g., a 2.4 GHz band), harmonic resonance does not occur with respect to the conductive pattern 480 in a first operational frequency band (e.g., a 28 GHz band) (regions 701 and 702). This may imply that there is no problem in resonance performance of the communication device 400 even if the conductive pattern 480 operating as an antenna is added to the communication device 400.

Figure 7B:
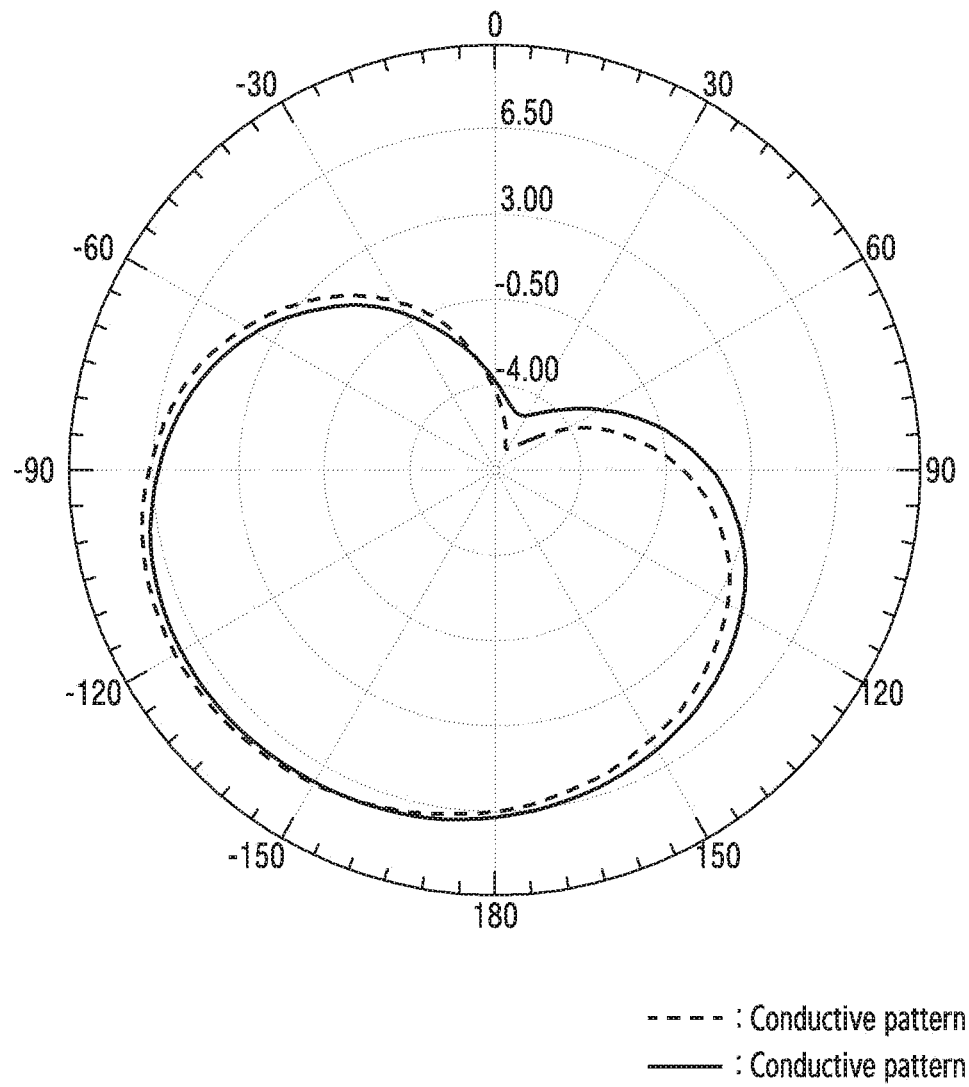
FIG. 7B illustrates a radiation pattern of a communication device on a basis of whether there is a conductive pattern according to an embodiment of the disclosure.

FIG. 7B illustrates a radiation pattern of a communication device on the basis of whether there is a conductive pattern according to an embodiment of the disclosure. It can be seen that, even if a conductive pattern (e.g., the conductive pattern 480 of FIG. 4A) of the communication device (e.g., the communication device 400 of FIG. 4A) is present, the same radiation performance is exhibited similarly to a case where the conductive pattern is not present.

Referring to FIG. 7B, an electronic device (e.g., the electronic device 200 of FIG. 2A) may include a housing (e.g., the housing 210 of FIG. 2A) including a first plate (e.g., the front plate 202 of FIG. 2A), a second plate (e.g., the rear plate 211 of FIG. 2B) facing away from the first plate, and a side member (e.g., the side bezel structure 218 of FIG. 2A) surrounding a space (e.g., the space 5103 of FIG. 5B) between the first plate and the second plate, a first PCB (e.g., the substrate 410 of FIG. 4A) disposed in parallel with the first plate in the space between the first plate and the second plate, and including a first face (e.g., the first substrate face 411 of FIG. 4A) facing the first plate and a second face (e.g., the second substrate face 412 of FIG. 4A) facing the second plate, at least one conductive plate (e.g., the first unit antennas 421 of FIG. 4A) formed on the second face, a first conductive pattern (e.g., the second unit antennas 431 and third unit antennas 441 of FIG. 4A) embedded in the first PCB and disposed to be closer to a portion of the side member than the conductive plate when viewed from above the first plate, a first wireless communication circuit (e.g., the first wireless communication circuit 490 of FIG. 4B) mounted on a first face of the first PCB, electrically coupled to the conductive plate and the first conductive pattern, and configured to perform at least one of transmission and reception of a signal having a frequency in the range of 6 GHz to 100 GHz, a dielectric structure (e.g., the first dielectric structure 450 of FIG. 4) disposed to the first face between the conductive plate and the side member when viewed from above the first plate, a second conductive pattern (e.g., the conductive pattern 480 of FIG. 4B) constructed on a face of the dielectric structure or embedded at least partially inside thereof, and a second wireless communication circuit (e.g., the second wireless communication circuit 521 of FIG. 5B) electrically coupled to the second conductive pattern and configured to perform at least one of transmission and reception of a signal having a frequency in the range of 0.5 GHz to 6 GHz.

According to various embodiments, the second wireless communication circuit (e.g., the second wireless communication circuit 521 of FIG. 5B) may be configured to support a Wi-Fi protocol.

According to various embodiments, the first conductive pattern (e.g., the second unit antennas 431 and third unit antennas 441 of FIG. 4A) may form a dipole antenna.

According to various embodiments, the electronic device may further include a display (e.g., the display 201 of FIG. 2A) disposed inside the space and visible through a portion of the first plate.

According to various embodiments, the dielectric structure (e.g., the first dielectric structure 450 of FIG. 4A) may be disposed between the first plate (e.g., the first plate 531 of FIG. 5B) and the first conductive pattern (e.g., the second unit antennas 431 and third unit antennas 441 of FIG. 4A).

According to various embodiments, the second conductive pattern (e.g., the conductive pattern 480 of FIG. 4B) may be disposed at a location spaced apart to the maximum extent possible from the at least one conductive plate (e.g., the first unit antennas 421 of FIG. 4A) in the dielectric structure.

According to various embodiments, the dielectric structure (e.g., the first dielectric structure 450 of FIG. 4A) may be disposed at a location at least partially overlapping with the first conductive pattern (e.g., the second unit antennas 431 and third unit antennas 441 of FIG. 4A) when viewed from above the first plate.

According to various embodiments, the dielectric structure may include a first face (e.g., the first face 451 of FIG. 4B) facing the first plate, a second face (e.g., the second face 452 of FIG. 4A) facing a second face of the first PCB (e.g., the second substrate face 412 of FIG. 4A), and a side face (e.g., the side face 453 of FIG. 4A) surrounding the first face and the second face. The side face may include a first side face (e.g., the first side face 4531 of FIG. 4A) facing the side member, a second side face (e.g., the second side face 4532 of FIG. 4A) facing away from the first side face, a third side face (e.g., the third side face 4533 of FIG. 4A) connecting the first side face and one end of the second side face, and a fourth side face (e.g., the fourth side face 4534 of FIG. 4A) connecting the first side face and the other end of the second side face.

According to various embodiments, the second conductive pattern (e.g., the conductive pattern 480 of FIG. 4B) may be disposed to the first face (e.g., the first face 451 of FIG. 4B) of the dielectric structure.

According to various embodiments, the second conductive pattern (e.g., the conductive pattern 480 of FIG. 4B) may be disposed to be extended through at least two faces among the first face, the second face, the first side face, the second side face, the third side face, and the fourth side face.

According to various embodiments, the second conductive pattern (e.g., the conductive pattern 480 of FIG. 4B) may be disposed to each of at least two faces among the first face, the second face, the first side face, the second side face, the third side face, and the fourth side face.

According to various embodiments, the conductive plate may be disposed such that a beam pattern is formed in a direction of the second plate, and the first conductive pattern may be disposed such that a beam pattern is formed in a direction of the side member.

According to various embodiments, the first conductive pattern may include a first antenna element (e.g., the first antenna element 4311 of FIG. 4A) disposed in a direction of the side member at an edge region of the first PCB, a second antenna element (e.g., the second antenna element 4312 of FIG. 4A) disposed with a specific interval from the first antenna element, a third antenna element (e.g., the third antenna element 4313 of FIG. 4A) disposed between the first antenna element and the second antenna element; and a fourth antenna element (e.g., the fourth antenna element 4314 of FIG. 4A) disposed with a specific interval in a horizontal direction from the third antenna element.

According to various embodiments, the first antenna element and the second antenna element may be constructed in the form of a conductive patch.

According to various embodiments, the electronic device further include a second PCB (e.g., the PCB 520 of FIG. 5B) disposed between the first plate and the second plate. The second wireless communication circuit may be mounted to the second PCB.

According to various embodiments, the first PCB (e.g., the substrate 410 of FIG. 4A) may be disposed to at least partially overlap with the second PCB (e.g., the PCB 520 of FIG. 5B).

According to various embodiments, the second conductive pattern may be electrically coupled to the second PCB by means of an electrical coupling member (e.g., the electrical coupling member 523 of FIG. 5B) when the second PCB (e.g., the PCB 520 of FIG. 5B) is disposed to the space of the electronic device.

According to various embodiments, the second conductive pattern (e.g., the conductive pattern 480 of FIG. 4B) may be constructed using a conductive plate attached to the dielectric structure (e.g., the first dielectric structure 450 of FIG. 4B), a conductive paint coated on the first dielectric structure, or LDS in the dielectric structure.

According to various embodiments, the first wireless communication circuit (e.g., the first wireless communication circuit 490 of FIG. 4B) may include a RFIC.

According to various embodiments, the electronic device may further include an IFIC (e.g., the communication module 350) electrically coupled to the first wireless communication circuit.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., an internal memory 136 or an external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
  a housing including a first plate, a second plate facing away from the first plate, and a side member surrounding a space between the first plate and the second plate;
  a first printed circuit board (PCB) disposed in parallel with the first plate in the space between the first plate and the second plate, and including a first face facing the first plate and a second face facing the second plate;
  at least one conductive plate formed on the second face;
  a first conductive pattern embedded in the first PCB and disposed to be closer to a portion of the side member than the conductive plate when viewed from above the first plate;
  a first wireless communication circuit mounted on a first face of the first PCB, electrically coupled to the conductive plate and the first conductive pattern, and configured to perform at least one of transmission and reception of a signal having a frequency in the range of about 6 GHz to 100 GHz;
  a dielectric structure disposed on the first face between the conductive plate and the side member when viewed from above the first plate;
  a second conductive pattern constructed on one face of the dielectric structure or embedded at least partially inside thereof; and
  a second wireless communication circuit electrically coupled to the second conductive pattern and configured to perform at least one of transmission and reception of a signal having a frequency in the range of about 0.5 GHz to 6 GHz.

2. The electronic device of claim 1, wherein the second wireless communication circuit is configured to support a Wi-Fi protocol.

3. The electronic device of claim 1, wherein the first conductive pattern forms a dipole antenna.

4. The electronic device of claim 1, further comprising a display disposed inside the space and visible through a portion of the first plate.

5. The electronic device of claim 1, wherein the dielectric structure is disposed between the first plate and the first conductive pattern.

6. The electronic device of claim 1, wherein the second conductive pattern is disposed at a location spaced apart from the at least one conductive plate in the dielectric structure so as to satisfy a specified radiation efficiency.

7. The electronic device of claim 1, wherein the dielectric structure is disposed at a location at least partially overlapping with the first conductive pattern when viewed from above the first plate.

8. The electronic device of claim 1,
  wherein the dielectric structure comprises:
    a first face facing the first plate;
    a second face facing the first face of the first PCB; and
    a side face surrounding the first face and the second face, and
  wherein the side face comprises:
    a first side face facing the side member;
    a second side face facing away from the first side face;
    a third side face connecting the first side face and one end of the second side face; and
    a fourth side face connecting the first side face and other end of the second side face.

9. The electronic device of claim 8, wherein the second conductive pattern is disposed on the first face of the dielectric structure.

10. The electronic device of claim 8, wherein the second conductive pattern is disposed on the dielectric structure to be extended through at least two faces among the first face, the second face, the first side face, the second side face, the third side face, or the fourth side face.

11. The electronic device of claim 8, wherein the second conductive pattern is disposed on each of at least two faces among the first face, the second face, the first side face, the second side face, the third side face, or the fourth side face.

12. The electronic device of claim 1, wherein the conductive plate is disposed such that a beam pattern is formed in a direction of the second plate, and the first conductive pattern is disposed such that a beam pattern is formed in a direction of the side member.

13. The electronic device of claim 1, wherein the first conductive pattern comprises:
  a first antenna element disposed in a direction of the side member at an edge region of the first PCB;
  a second antenna element disposed with a specific interval from the first antenna element;
  a third antenna element disposed between the first antenna element and the second antenna element; and
  a fourth antenna element disposed with a specific interval in a horizontal direction from the third antenna element.

14. The electronic device of claim 13, wherein the first antenna element and the second antenna element are constructed in a form of a conductive patch.

15. The electronic device of claim 1, further comprising a second PCB disposed between the first plate and the second plate,
  wherein the second wireless communication circuit is mounted to the second PCB.

16. The electronic device of claim 15, wherein the second conductive pattern is electrically coupled to the second PCB by means of an electrical coupling member when the second PCB is disposed to the space of the electronic device.

17. The electronic device of claim 15, wherein the first PCB is disposed to at least partially overlap with the second PCB.

18. The electronic device of claim 1, wherein the second conductive pattern is constructed using a conductive plate attached to the dielectric structure, a conductive paint coated on the first dielectric structure, or laser direct structuring (LDS) in the dielectric structure.

19. The electronic device of claim 1, wherein the first wireless communication circuit includes a radio frequency integrated circuit (RFIC).

20. The electronic device of claim 19, further comprising an intermediate frequency integrated circuit (IFIC) electrically coupled to the first wireless communication circuit.

* * * * *